(12) United States Patent
Wang et al.

(10) Patent No.: US 10,236,904 B1
(45) Date of Patent: Mar. 19, 2019

(54) DIGTAL-TO-ANALOG CONVERSION CIRCUIT AND METHOD THEREOF, AND DISPLAY APPARATUS

(71) Applicant: BOE TECHNOLOGY GROUP CO., LTD., Beijing (CN)

(72) Inventors: Tangxiang Wang, Beijing (CN); Chen Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/987,201

(22) Filed: May 23, 2018

(30) Foreign Application Priority Data

Nov. 22, 2017 (CN) .......................... 2017 1 1179479

(51) Int. Cl.
*H03M 1/76* (2006.01)
*G09G 3/3225* (2016.01)

(52) U.S. Cl.
CPC ............ *H03M 1/76* (2013.01); *G09G 3/3225* (2013.01); *G09G 2310/027* (2013.01)

(58) Field of Classification Search
CPC .. H03M 1/76; G09G 3/3225; G09G 2310/027
USPC .................................................. 341/144, 148
See application file for complete search history.

(56) References Cited

U.S. PATENT DOCUMENTS

| 8,619,013 | B2* | 12/2013 | Kwon | .................. | G09G 3/2011 |
| | | | | | 341/144 |
| 8,786,479 | B2* | 7/2014 | Tsuchi | .................. | G09G 3/3688 |
| | | | | | 341/144 |
| 9,978,331 | B2* | 5/2018 | Guo | ........................ | H03M 1/76 |

* cited by examiner

*Primary Examiner* — Brian K Young

(74) *Attorney, Agent, or Firm* — Kinney & Lange, P.A.

(57) ABSTRACT

Embodiments of the present application provide a digital-to-analog conversion circuit, a method thereof and a display apparatus. The digital-to-analog conversion circuit comprises a voltage dividing sub-circuit, having $2^m$ of voltage dividing signal terminals and $2^{n-m}-1$ of sub-voltage dividing signal terminals; a first voltage selecting sub-circuit, configured to receive the first bit to the $(n-m)^{th}$ bit of the digital signal, and convert it into a first analog signal; a second voltage selecting sub-circuit, configured to receive the $(n-m+1)^{th}$ bit to the $n^{th}$ bit of the digital signal and to convert it into a second analog signal; and a buffering sub-circuit, configured to generate an analog signal based on the first analog signal, the second analog signal and the signal from the $i^{th}$ voltage dividing signal terminal and to output the analog signal to an analog signal outputting terminal of the digital-to-analog conversion circuit.

13 Claims, 5 Drawing Sheets

DIGTAL-TO-ANALOG CONVERSION CIRCUIT AND METHOD THEREOF, AND DISPLAY APPARATUS

CROSS-REFERENCE TO RELATED APPLICATION(S)

This application claims the priority of Chinese Patent Application No. 201711179479.X filed on Nov. 22, 2017, the disclosure of which is incorporated herein by reference in its entirety as part of this application.

BACKGROUND

Embodiments of the present disclosure relate generally to the field of display technology, and more particularly to a digital-to-analog conversion circuit, a method thereof, and a display apparatus.

Active matrix organic light emitting diode (AMOLED) displays have advantages such as very light weight, wide viewing angle, low power consumption, fast response, and natural color. In an AMOLD display system, the column driver circuit converts a digital image signal into a corresponding analog signal and provides it directly to an OLED pixel array. Each column driver circuit includes hundreds or even thousands of digital-to-analog converters (DACs). Therefore, the area of the DAC has a large influence on the area of the entire column driver circuit.

With developments in display technology, requirements on the performance of the DAC in the display have increased, resulting in a complex DAC structure and a large occupied area of chips.

SUMMARY

According to an aspect of embodiments of the present disclosure, there is provided a digital-to-analog conversion circuit, comprising a voltage dividing sub-circuit, a first voltage selecting sub-circuit, a second voltage selecting sub-circuit, and a buffering sub-circuit. The voltage dividing sub-circuit has $2^m$ of voltage dividing signal terminals, referred as the $0^{th}$ to the $(2^m-1)^{th}$ voltage dividing signal terminals arranged in an ascending order of voltage, and has $2^{n-m}-1$ of sub-voltage dividing signal terminals disposed between the $i^{th}$ voltage dividing signal terminal and the $(i+1)^{th}$ voltage dividing signal terminal, referred as the first to the $(2^{n-m}-1)^{th}$ sub-voltage dividing signal terminals arranged in the ascending order of voltage, wherein n is the number of bits of a digital signal, m is an integer greater than or equal to 0 and less than or equal to n, and i is an integer greater than or equal to 1 and less than or equal to $2^m$. The first voltage selecting sub-circuit is coupled to the $i^{th}$ voltage dividing signal terminal, the $(i+1)^{th}$ voltage dividing signal terminal, and the $2^{m-n}-1$ of sub-voltage dividing signal terminals of the voltage dividing sub-circuit, and is configured to receive the first bit to the $(n-m)^{th}$ bit of the digital signal, and to convert the first bit to the $(n-m)^{th}$ bit of the digital signal into a first analog signal. The second voltage selecting sub-circuit is coupled to the $2^m$ of voltage dividing signal terminals of the voltage dividing sub-circuit, and is configured to receive the $(n-m+1)^{th}$ bit to the $n^{th}$ bit of the digital signal and convert the $(n-m+1)^{th}$ bit to the $n^{th}$ bit of the digital signal into a second analog signal. The buffering sub-circuit is coupled to the first voltage selecting sub-circuit, the second voltage selecting sub-circuit, and the $i^{th}$ voltage dividing signal terminal of the voltage dividing sub-circuit respectively, and is configured to generate an analog signal based on the first analog signal, the second analog signal and the signal from the $i^{th}$ voltage dividing signal terminal and to output the analog signal to an analog signal outputting terminal of the digital-to-analog conversion circuit.

The digital-to-analog conversion circuit may further comprise a string of resistors including $2^m-1$ of resistors connected in series, a high reference voltage terminal, and a low reference voltage terminal. The string of resistors comprises $2^m$ of nodes, referred as the $0^{th}$ to the $(2^m-1)^{th}$ nodes arranged in the ascending order of voltage, wherein the $0^{th}$ node is coupled to the low reference voltage terminal, the $(2^m-1)^{th}$ node is coupled to the high reference voltage terminal, and the $0^{th}$ to the $(2^m-1)^{th}$ nodes are respectively coupled to the $0^{th}$ to the $(2^m-1)^{th}$ voltage dividing signal terminals.

For another example, the resistor disposed between the $i^{th}$ serial node and the $(i+1)^{th}$ serial node may comprise a string of sub-resistors including $2^{n-m}$ of sub-resistors connected in series, wherein the string of sub-resistors comprises $2^{n-m}-1$ of sub-nodes, referred as the first to the $(2^{n-m}-1)^{th}$ sub-nodes arranged in the ascending order of voltage, wherein the first to the $(2^{n-m}-1)^{th}$ sub-nodes are respectively coupled to the first to the $(2^{n-m}-1)^{th}$ sub-voltage dividing signal terminals.

For another example, the first voltage selecting sub-circuit may comprise a first switching network formed as a (n−m) bits of binary switching tree, wherein each inputting terminal of the first switching network is coupled to the $i^{th}$ voltage dividing signal terminal, the $(i+1)^{th}$ voltage dividing signal terminal, and the first to the $(2^{n-m}-1)^{th}$ sub-voltage dividing signal terminals, and an outputting terminal of the first switching network is coupled to an in-phase inputting terminal of the buffering sub-circuit.

For another example, the second voltage selecting sub-circuit may be a second switching network formed as a m bits of binary switching tree, wherein each inputting terminal of the second switching network is coupled to the $0^{th}$ to the $(2^m-1)^{th}$ voltage dividing signal terminal, and an outputting terminal of the second switching network is coupled to an in-phase inputting terminal of the buffering sub-circuit.

For another example, the $i^{th}$ voltage dividing signal terminal may be coupled to an inverting inputting terminal of the buffering sub-circuit.

For another example, the first switching network may comprise a plurality of switches containing a P-channel metal oxide semiconductor field effect transistor and an N-channel metal oxide semiconductor field effect transistor.

For another example, in the first switching network, a switch of the plurality of switches coupled to the $i^{th}$ voltage dividing signal terminal and the first to the $(2^{n-m}-1)$th sub-voltage dividing signal terminals may contain the P-channel metal oxide semiconductor field effect transistor, and a switch of the plurality of switches coupled to the $(2^{n-m-1})^{th}$ to the $(2^{n-m}-1)^{th}$ sub-voltage dividing signal terminals may contain the N-channel metal oxide semiconductor field effect transistor.

For another example, the second switching network may comprise a plurality of switches containing a P-channel metal oxide semiconductor field effect transistor and an N-channel metal oxide semiconductor field effect transistor.

For another example, in the second switching network, a switch of the plurality of switches coupled to the $0^{th}$ voltage dividing signal terminal and the $(2^{m-1}-1)^{th}$ voltage dividing signal terminal may contain the P-channel metal oxide semiconductor field effect transistor, and a switch of the plurality of switches coupled to the $(2^{m-1})^{th}$ to the $(2^m-1)^{th}$ voltage dividing signal terminals may contain the N-channel metal oxide semiconductor field effect transistor.

According to another aspect of embodiments of the present disclosure, there is provided a display apparatus comprising the digital-to-analog conversion circuit discussed above.

According to yet another aspect of embodiments of the present disclosure, there is provided a digital-to-analog conversion method for a digital-to-analog conversion circuit according to the embodiments of the present disclosure, comprising: receiving the first bit to the $(n-m)^{th}$ bit of the digital signal, and converting the first bit to the $(n-m)^{th}$ bit of the digital signal to the first analog signal; receiving the $(n-m+1)^{th}$ bit to the $n^{th}$ bit of the digital signal, and converting the $(n-m+1)^{th}$ bit to the $n^{th}$ bit of the digital signal to the second analog signal; and generating an analog signal based on the first analog signal, the second analog signal and a signal from the $i^{th}$ voltage dividing signal terminal, and outputting the analog signal to the analog signal outputting terminal of the digital-to-analog conversion circuit In some cases, generating the analog signal based on the first analog signal, the second analog signal, and the signal from the $i^{th}$ voltage dividing signal terminal can comprise generating the analog signal by summing the first analog signal and the second analog signal to obtain a summed signal and then subtracting the signal from the $i^{th}$ voltage dividing signal terminal from the summed signal.

BRIEF DESCRIPTION OF THE DRAWINGS

In order to describe solutions of the embodiments of the present disclosure more clearly, the accompanying drawings will be described briefly hereinafter. It should be noted that the accompanying drawings in the following description only relate to some embodiments of the present disclosure, but not to limiting the present disclosure, in which.

DETAILED DESCRIPTION

In order to understand the above objects, features and advantages of the present invention clearly, embodiments of the present invention will be further described in detail below with reference to the accompanying drawings. It should be noted that the embodiments of the present application and the features in the embodiments may be combined with each other without departing from the scope and spirit of the present disclosure.

Technical or scientific terms used in the embodiments of the present disclosure should be in the ordinary sense understood by those skilled in the art, unless otherwise defined. The terms of "first", "second" and the like used in the embodiments of the present disclosure do not indicate any order, quantity, or importance, but are only used to distinguish one component from another. The use of "including" or "comprising", and the like, means that the elements or objects immediately preceding the word encompass the elements or objects listed after the word and their equivalents, without excluding other elements or objects. The words such as "connected to" or "coupled to" and the like are not limited to physical or mechanical connections, but may also include electrical connections, whether direct or indirect.

Digital-to-analog conversion circuits DACs generally used in displays mainly include a current steering DAC and a resistor string voltage dividing DAC. The current steering DAC has advantages such as high speed and high precision. However, when the current steering DAC is used to transmit a driving signal to a transmission line, in order to suppress a reflection of the transmission signal, it is necessary to ensure the output impedance of the current steering DAC being equal to the characteristic impedance of the transmission line, which results in a large power consumption. The resistor string voltage dividing DAC has advantages such as simple structure, low noise and good linearity. However, the accuracy of the resistor string voltage dividing DAC is mainly determined by the matching of the resistor string.

Figure 1:
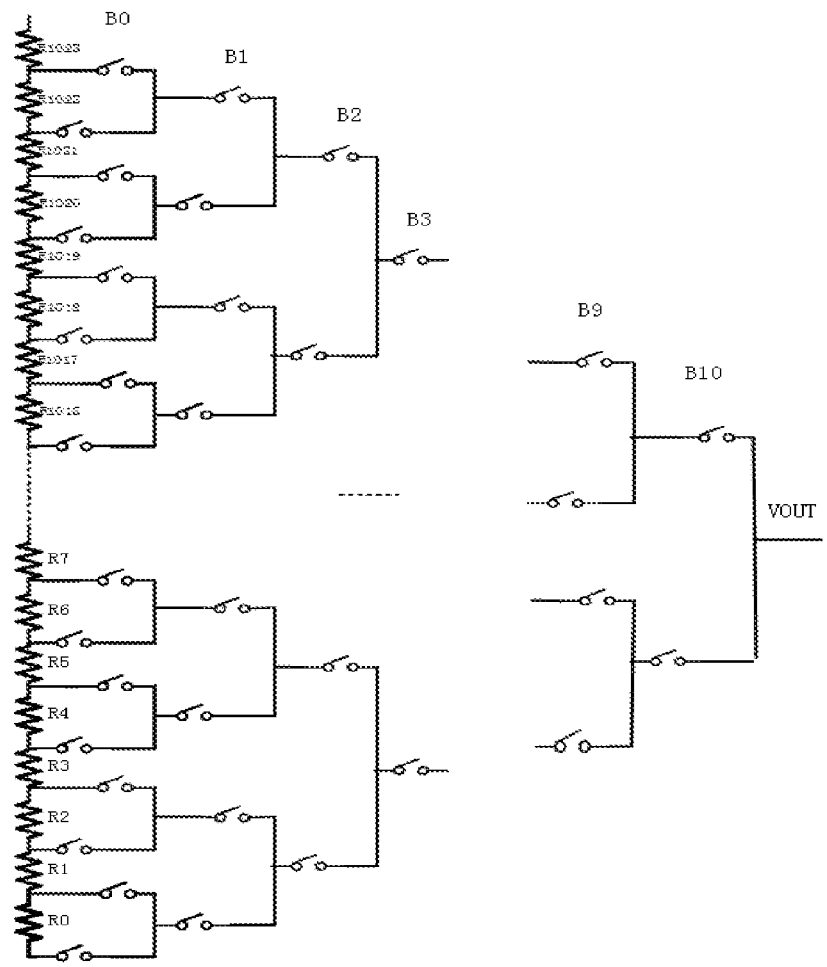
FIG. 1 shows a schematic structural diagram illustrating a resistor string voltage dividing 10 bit DAC.

FIG. 1 shows a schematic structural diagram illustrating a resistor string voltage dividing 10 bit DAC. As shown in FIG. 1, the resistor string voltage dividing 10 bit DAC may comprise a string of resistors and a 10 bit binary switching network. The string includes 1024 of resistors connected in series Rx (x=0, 1, 2, . . . 1023), which have the same resistance with each other. The string of resistors also includes 1025 of nodes. The 10 bit binary switching network may comprise 2046 of switches. The nodes in the string of resistors are coupled to the signal inputting terminals of the 10 bit binary selecting switching network, respectively. The digital signal B0 to B9 select the corresponding reference voltage from the string of resistors by controlling the 10 bit binary switching network to realize a digital-to-analog conversion. Since there are 1024 resistors in the above 10 bit DAC, 1024 reference voltage points are also required, resulting in a complicated structure. In addition, the 10 bit DAC generally occupies 60%-70% of an area of a chip, resulting in a large chip area. Thus, it is not adapted to an AMOLED with a high resolution.

Figure 2:
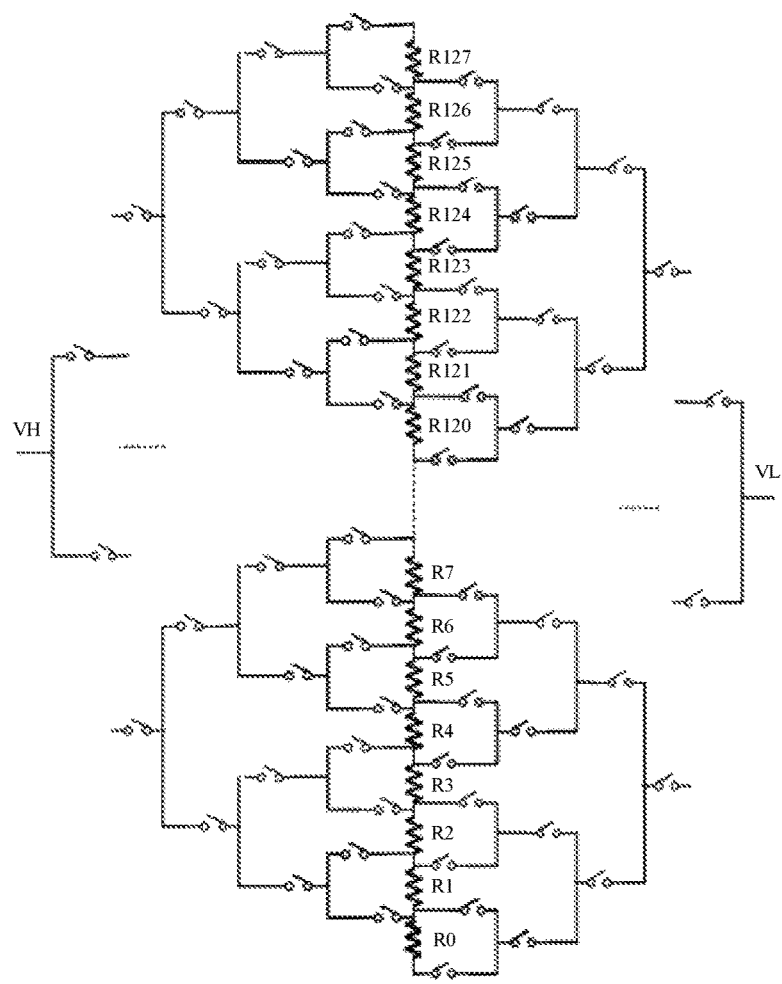
FIG. 2 shows a schematic structural diagram illustrating a circuit of a first stage of a two-stage DAC.

A two-stage 10 bit DAC has also been proposed. FIG. 2 shows a schematic structural diagram illustrating a circuit of a first stage of a two-stage DAC. As shown in FIG. 2, the first stage of the two-stage 10 bit DAC includes a global string of resistors and an adjacent voltage selector. The selecting of adjacent voltages is implemented by two sets of single voltage selecting circuits. The two sets of single voltage selecting circuits are intended to select two adjacent voltage values $V_L$ and $V_H$ from the global string of resistors respectively. The second stage of the two-stage 10 bit DAC can achieve accurate voltage division by performing voltage division with a string of resistors or with capacitors. For the DAC with the first stage being n-m bits, the first stage may comprise two sets of n-m bits of single voltage selecting circuits. FIG. 2 illustrates an example where n=10 and m=3. The number of resistors of the two-stage DAC is ¼ of the number of the resistors in the resistor string voltage dividing 10 bit DAC. Although the number of resistors is reduced, the reference voltage points are not reduced. Thus, the structure is still complex, occupying a large area of the chip and not suitable for high resolution AMOLEDs.

Accordingly, embodiments of the present disclosure provide a digital-to-analog conversion circuit, a method thereof, and a display apparatus.

Figure 3:
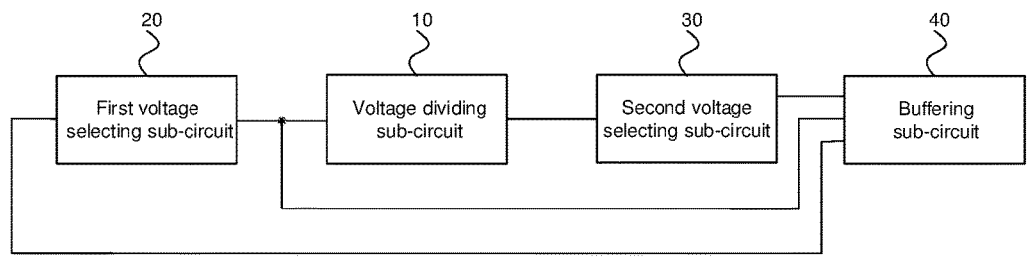
FIG. 3 shows a schematic structural diagram illustrating a digital-to-analog conversion circuit according to embodiments of the present disclosure.

FIG. 3 shows a schematic structural diagram illustrating a digital-to-analog conversion circuit according to embodiments of the present disclosure. As shown in FIG. 3, the digital-to-analog conversion circuit according to the embodiments of the present disclosure may include a voltage dividing sub-circuit 10, a first voltage selecting sub-circuit 20, a second voltage selecting sub-circuit 30, and a buffering sub-circuit 40.

For example, the voltage dividing sub-circuit 10 may have $2^m$ of voltage dividing signal terminals, referred as the $0^{th}$ to the $(2^m-1)^{th}$ voltage dividing signal terminals arranged in an ascending order of voltage. There are $2^{n-m}-1$ of sub-voltage dividing signal terminals disposed between the $i^{th}$ voltage dividing signal terminal and the $(i+1)^{th}$ voltage dividing signal terminal, referred as the first to the $(2^{n-m}-1)^{th}$ sub-voltage dividing signal terminals arranged in the ascending order of voltage.

The voltage dividing sub-circuit can be a global string of resistors. It should be noted that the value of n is related to the requirements on the performance of the DAC in the display. If the performance of the DAC in the display requires 10 bits, then n=10. In addition, m is an integer greater than or equal to 0 and less than or equal to n, and i is an integer greater than or equal to 0 and less than or equal to $2^m-1$.

The first voltage selecting sub-circuit 20 is coupled to the $i^{th}$ voltage dividing signal terminal, the $(i+1)^{th}$ voltage dividing signal terminal and the $2^{n-m}-1$ of sub-voltage dividing signal terminals of the voltage dividing sub-circuit 10, and configured to receive the first bit to the $(n-m)^{th}$ bit of the digital signal, and to convert the first bit to the $(n-m)^{th}$ bit of the digital signal into a first analog signal.

If the digital signal is a 10-bit binary sequence D9D8D7D6D5D4D3D2D1D0 (wherein D0~D9=0 or 1), then D0 is the first bit of the digital signal, D1 is the second bit of the digital signal, D3 is the third bit of the digital signal, similarly D9 is the $10^{th}$ bit of the digital signal.

For example, the first voltage selecting sub-circuit converts the first bit to the $(n-m)^{th}$ bit of the digital signal. That is, the first voltage selecting sub-circuit converts the low-gray digital signal.

For example, i is greater than or equal to 1 and less than or equal to $2^m$. The present disclosure does not specific the range of i. For example, i is $2^{m-1}-1$.

The second voltage selecting sub-circuit 30 is coupled to the $2^m$ of voltage dividing signal terminals of the voltage dividing sub-circuit 10, and configured to receive the $(n-m+1)^{th}$ bit to the $n^{th}$ bit of the digital signal and to convert the $(n-m+1)^{th}$ bit to the $n^{th}$ bit of the digital signal into a second analog signal.

The second voltage selecting sub-circuit converts the $(n-m+1)^{th}$ bit to the $n^{th}$ bit of the digital signal. That is, the second voltage selecting sub-circuit converts the high-gray digital signal.

The buffering sub-circuit 40 is coupled to the first voltage selecting sub-circuit 20, the second voltage selecting sub-circuit 30 and the $i^{th}$ voltage dividing signal terminal of the voltage dividing sub-circuit 10 respectively, and configured to generate an analog signal based on the first analog signal, the second analog signal and the signal from the $i^{th}$ voltage dividing signal terminal and to output the analog signal to an analog signal outputting terminal of the digital-to-analog conversion circuit.

The inputting terminal of the buffering sub-circuit is further coupled to the analog signal outputting terminal of the digital-to-analog conversion circuit. For example, a resultant analog signal is generated by summing the first analog signal and the second analog signal to obtain a summed signal and then subtracting the signal from the $i^{th}$ voltage dividing signal terminal from the summed signal. It should be noted that the buffering sub-circuit can perform the function of an adder, thus saving the area for the adder.

According to the embodiments of the present disclosure, the digital-to-analog conversion circuit applies a segmented mode. Due to a mutual configuration of the sub-circuits, only $2^m+2^{n-m}-1$ voltage dividing signal terminals and $2^m+2^{n-m}-2$ resistors are required to output $2^n$ analog signals with different voltages. This can simplify the structure of the digital-to-analog conversion circuit and reduce the area of the digital-to-analog conversion circuit, which make the digital-to-analog conversion circuit suitable for a high resolution AMOLED.

Figure 4:
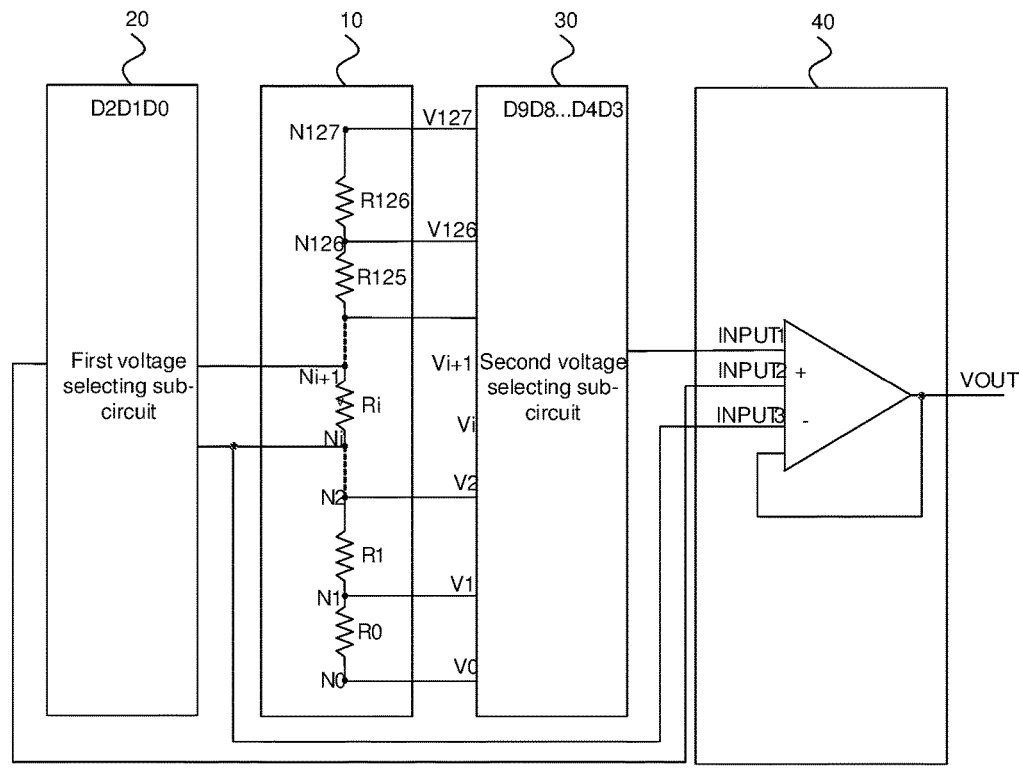
FIG. 4 shows a schematic structural diagram illustrating another digital-to-analog conversion circuit according to the embodiments of the present disclosure.

FIG. 4 shows a schematic structural diagram illustrating another digital-to-analog conversion circuit according to the embodiments of the present disclosure. FIG. 4 shows an example of n=10 and m=7. As shown in FIG. 4, the voltage dividing sub-circuit 10 may comprise: a string of resistors including $2^m-1$ resistors connected in series, a high reference voltage terminal, and a low reference voltage terminal. The string of resistors comprises $2^m$ nodes, referred as the $0^{th}$ to the $(2^m-1)^{th}$ nodes arranged in the ascending order of voltage. The $0^{th}$ node is coupled to the low reference voltage terminal, the $(2^m-1)^{th}$ node is coupled to the high reference voltage terminal, and the $0^{th}$ to the $(2^m-1)^{th}$ nodes are respectively coupled to the $0^{th}$ to the $(2^m-1)^{th}$ voltage dividing signal terminals.

For example, as shown in FIG. 4, the string of resistors may comprise 127 of resistors having the same resistance Rx(x=0, 1, . . . 126) and 128 of nodes Ni (i=0, 1, . . . 127). The resistor disposed between the $i^{th}$ serial node and the $(i+1)^{th}$ serial node comprises a string of sub-resistors including $2^{n-m}$ sub-resistors connected in series. The string of sub-resistors comprises $2^{n-m}-1$ of sub-nodes, referred as the first to the $(2^{n-m}-1)^{th}$ sub-nodes arranged in the ascending order of voltage, wherein the first to the $(2^{n-m}-1)^{th}$ sub-nodes are respectively coupled to the first to the $(2^{n-m}-1)^{th}$ sub-voltage dividing signal terminals.

For example, $2^{n-m}$ sub-resistors have the same resistance with each other.

The potentials at the $0^{th}$ to the $(2^m-1)^{th}$ node are V0, V1, V2, . . . V$2^m-1$, respectively.

For example, the $i^{th}$ voltage dividing signal terminal is coupled to an inverting inputting terminal of the buffering sub-circuit.

Figure 5:
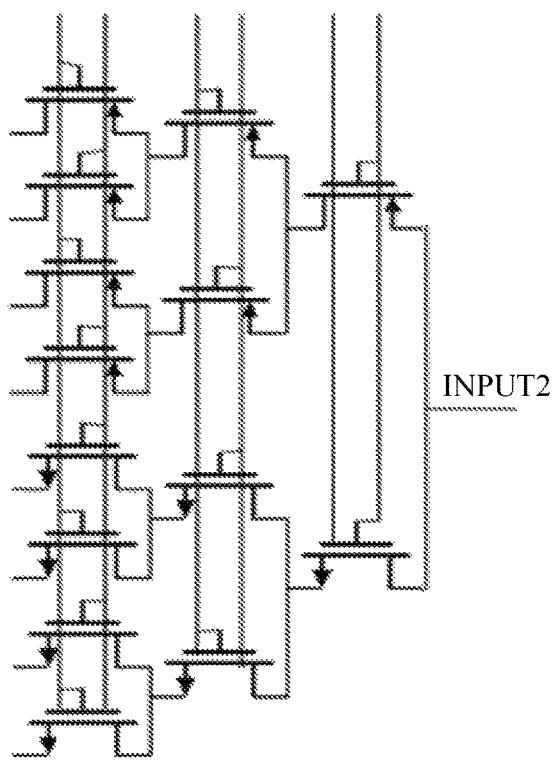
FIG. 5 shows a schematic structural diagram illustrating a first voltage selecting sub-circuit according to the embodiments of the present disclosure.

FIG. 5 shows a schematic structural diagram illustrating a first voltage selecting sub-circuit according to the embodiments of the present disclosure. As shown in FIG. 5, the first voltage selecting sub-circuit is a first switching network formed as a (n-m) bits of binary switching tree. It should be noted that FIG. 5 illustrates the example of n=10 and m=7. That is, FIG. 5 shows an example that the first switching network is a 3 bits of binary switching tree.

For example, each inputting terminal of the first switching network is coupled to the $i^{th}$ voltage dividing signal terminal, the $(i+1)^{th}$ voltage dividing signal terminal, and the first to the $(2^{n-m}-1)^{th}$ sub-voltage dividing signal terminals, and an outputting terminal of the first switching network is coupled to an in-phase inputting terminal of the buffering sub-circuit.

The $0^{th}$ to the $(n-m)^{th}$ bits of the digital signal are converted into the first analog signal. For example, taking i=63 for an example, when D2D1D0 is 000, 001, . . . 110, 111 sequentially, the outputs are respectively shown in Table 1:

TABLE1

| D2D1D0 | V |
|---|---|
| 000 | V63 |
| 001 | V63+1/8(V64−V63) |
| 010 | V63+2/8(V64−V63) |
| 011 | V63+3/8(V64−V63) |
| 100 | V63+4/8(V64−V63) |
| 101 | V63+5/8(V64−V63) |
| 110 | V63+6/8(V64−V63) |
| 111 | V63+7/8(V64−V63) |

For example, the first switching network comprises a plurality of switches containing a P-channel metal oxide semiconductor field effect transistor and an N-channel metal oxide semiconductor field effect transistor. In the first switching network, a switch of the plurality of switches coupled to the $i^{th}$ voltage dividing signal terminal and the first to the $(2^{n-m}-1)^{th}$ sub-voltage dividing signal terminals contains the P-channel metal oxide semiconductor field effect transistor, and a switch of the plurality of switches coupled to the $(2^{n-m-1})^{th}$ to the $(2^{n-m}-1)^{th}$ sub-voltage dividing signal terminals contains the N-channel metal oxide semiconductor field effect transistor.

For example, the second voltage selecting sub-circuit is a second switching network formed as a m bits of binary switching tree. Each inputting terminal of the second switching network is coupled to the $0^{th}$ to the $(2^m-1)^{th}$ voltage dividing signal terminal, and an outputting terminal of the second switching network is coupled to an in-phase inputting terminal of the buffering sub-circuit.

The $(n-m+1)^{th}$ to the $n^{th}$ bits of the digital signal are converted into the second analog signal. For example, when D9D8D7D6D5D4D3 is 0000000, 0000001, . . . , 1111110, 111111 sequentially, the outputs are V0, V1, . . . , V126, V127, respectively.

For example, the second switching network comprises a plurality of switches containing a P-channel metal oxide semiconductor field effect transistor and an N-channel metal oxide semiconductor field effect transistor. In the second switching network, a switch of the plurality of switches coupled to the $0^{th}$ voltage dividing signal terminal and the $(2^{m-1}-1)^{th}$ voltage dividing signal terminal contains the P-channel metal oxide semiconductor field effect transistor, and a switch of the plurality of switches coupled to the $(2^{m-1})^{th}$ to the $(2^m-1)^{th}$ voltage dividing signal terminals contains the N-channel metal oxide semiconductor field effect transistor.

In the embodiment, the first voltage selecting sub-circuit and the second voltage selecting sub-circuit use a P-channel metal oxide semiconductor field effect transistor PMOS and an N-channel metal oxide semiconductor field effect transistor NMOS as the switch instead of a transmission gate. By using PMOS transistors at a high gray-scale, a full-range transmission can be guaranteed. Thus, the number of switches is further reduced by half on the basis of the improvement, further reducing the area occupied by the chip.

For example, as shown in FIG. 4, n=10, m=3 and i=63 is taken for illustration. The plurality of inputting terminals of the buffering sub-circuit 40 comprises the inputting terminal INPUT2 coupled to the outputting terminal of the first voltage selecting sub-circuit 10, the inputting terminal INPUT 1 coupled to the second voltage selecting sub-circuit 20 and the inputting terminal INPUT 3 coupled to the signal from the $i^{th}$ voltage dividing terminal. Thus, a resultant outputting signal VOUT will be INPUT1+(INPUT2−INPUT3), i.e., INPUT1+N/8(V64−V63), wherein n is an integer ranges from 0~7, INPUT 1 is selected by a high 7 bit grey-scale voltage, N is determined by the low 3 bits of the digital signal. This will achieve an accuracy of 10 bit.

Figure 6:
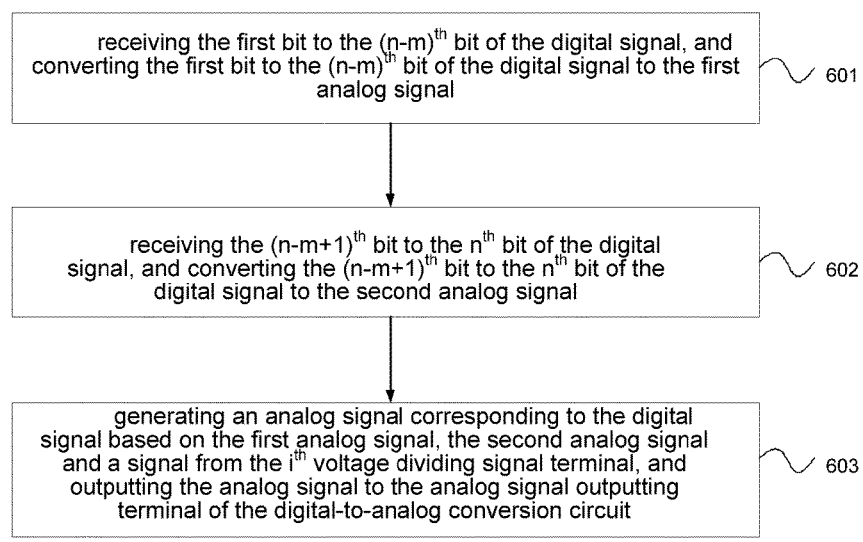
FIG. 6 shows a flowchart of a digital-to-analog conversion method according to an embodiment of the present disclosure.

FIG. 6 shows a flowchart of a digital-to-analog conversion method according to an embodiment of the present disclosure. The digital-to-analog conversion method can be applied to the digital-to-analog conversion circuit according to the embodiments of the present disclosure. As shown in FIG. 6, the digital-to-analog conversion method 60 according to the embodiments of the present disclosure may comprise following steps.

In step 601, the first bit to the $(n-m)^{th}$ bit of the digital signal is received and then converted into the first analog signal;

In step 602, the $(n-m+1)^{th}$ bit to the $n^{th}$ bit of the digital signal is received, and then converted into the second analog signal.

In step 603, an analog signal is generated based on the first analog signal, the second analog signal and a signal from the $i^{th}$ voltage dividing signal terminal. The generated analog signal is outputted to the analog signal outputting terminal of the digital-to-analog conversion circuit.

In particular, in step 603, the analog signal can be generated by summing the first analog signal and the second analog signal to obtain a summed signal and then subtracting the signal from the $i^{th}$ voltage dividing signal terminal from the summed signal.

According to the embodiments of the present disclosure, the digital-to-analog conversion method applies a segmented mode. Due to a mutual configuration of the sub-circuits, only $2^m+2^{n-m}-1$ of voltage dividing signal terminals and $2^m+2^{n-m}-2$ of resistors are required to output $2^n$ of analog signals with different voltages. This can simplify the structure of the digital-to-analog conversion circuit and reduce the area of the digital-to-analog conversion circuit, which make the digital-to-analog conversion method suitable for a high resolution AMOLED.

The embodiments of the present disclosure further provide a display apparatus comprising the digital-to-analog conversion circuit according to any of disclosed embodiments.

The display apparatus may be a display panel on which the digital-to-analog conversion circuit can be disposed. Preferably, the display apparatus may be any product or component having a display function, such as an OLED panel, a cell phone, a tablet, a television, a display, a laptop, a digital photo frame, a navigator and the like.

The drawings of the embodiments of the present disclosure relate only to the structures involved in the embodiments of the present disclosure, and other structures may refer to the normal designs.

For the sake of clarity, the thickness and size of layers or microstructures are exaggerated in the drawings for describing embodiments of the present disclosure. It should be noted that the embodiments of the present disclosure, more specifically, the features in the embodiments may be combined with each other to obtain new embodiments without conflicting.

The foregoing descriptions are merely illustrative of the technical aspects of the present disclosure and are not intended to be limiting thereof. It should be noted that those skilled in the art may make several improvements and modifications without departing from the embodiments of the present disclosure. The improvements and modifications should also be considered within the scope of the present disclosure.

The invention claimed is:

1. A digital-to-analog conversion circuit, comprising:
a voltage dividing sub-circuit having $2^m$ voltage dividing signal terminals, referred to as the $0^{th}$ to the $(2^m-1)^{th}$ voltage dividing signal terminals arranged in an ascending order of voltage, and having $2^{n-m}-1$ sub-voltage dividing signal terminals disposed between the $i^{th}$ voltage dividing signal terminal and the $(i+1)^{th}$ voltage dividing signal terminal, referred as the first to the $(2^{n-m}-1)^{th}$ sub-voltage dividing signal terminals arranged in the ascending order of voltage, wherein n is the number of bits of a digital signal, m is an integer greater than or equal to 0 and less than or equal to n, i is an integer greater than or equal to 1 and less than or equal to $2^m$;
a first voltage selecting sub-circuit, coupled to the $i^{th}$ voltage dividing signal terminal, the $(i+1)^{th}$ voltage dividing signal terminal and the $2^{n-m}-1$ of sub-voltage dividing signal terminals of the voltage dividing sub-circuit, and configured to receive the first bit to the $(n-m)^{th}$ bit of the digital signal, and to convert the first bit to the $(n-m)^{th}$ bit of the digital signal into a first analog signal;
a second voltage selecting sub-circuit, coupled to the $2^m$ voltage dividing signal terminals of the voltage dividing sub-circuit, and configured to receive the $(n-m+1)^{th}$ bit to the $n^{th}$ bit of the digital signal and to convert the $(n-m+1)^{th}$ bit to the $n^{th}$ bit of the digital signal into a second analog signal; and
a buffering sub-circuit, coupled to the first voltage selecting sub-circuit, the second voltage selecting sub-circuit and the $i^{th}$ voltage dividing signal terminal of the voltage dividing sub-circuit respectively, and configured to generate an analog signal based on the first analog signal, the second analog signal and the signal from the $i^{th}$ voltage dividing signal terminal and to output the analog signal to an analog signal outputting terminal of the digital-to-analog conversion circuit.

2. The digital-to-analog conversion circuit of claim 1, wherein the voltage dividing sub-circuit further comprises:
a string of resistors including $2^m-1$ of resistors connected in series, a high reference voltage terminal, and a low reference voltage terminal;
the string of resistors comprises $2^m$ of nodes, referred as the $0^{th}$ to the $(2^m-1)^{th}$ nodes arranged in the ascending order of voltage, wherein the $0^{th}$ node is coupled to the low reference voltage terminal, the $(2^m-1)^{th}$ node is coupled to the high reference voltage terminal, the $0^{th}$ to the $(2^m-1)^{th}$ nodes are respectively coupled to the $0^{th}$ to the $(2^m-1)^{th}$ voltage dividing signal terminals.

3. The digital-to-analog conversion circuit of claim 2, wherein the resistor disposed between the $i^{th}$ serial node and the $(i+1)^{th}$ serial node comprises a string of sub-resistors including $2^{n-m}$ sub-resistors connected in series, wherein the string of sub-resistors comprises $2^{n-m}-1$ sub-nodes, referred as the first to the $(2^{n-m}-1)^{th}$ sub-nodes arranged in the ascending order of voltage, wherein the first to the $(2^{n-m}-1)^{th}$ sub-nodes are respectively coupled to the first to the $(2^{n-m}-1)^{th}$ sub-voltage dividing signal terminals.

4. The digital-to-analog conversion circuit of claim 1, wherein the first voltage selecting sub-circuit comprises a first switching network formed as a (n-m) bits of binary switching tree;
wherein each inputting terminal of the first switching network is coupled to the $i^{th}$ voltage dividing signal terminal, the $(i+1)^{th}$ voltage dividing signal terminal, and the first to the $(2^{n-m}-1)^{th}$ sub-voltage dividing signal terminals, and an outputting terminal of the first switching network is coupled to an in-phase inputting terminal of the buffering sub-circuit.

5. The digital-to-analog conversion circuit of claim 1, wherein the second voltage selecting sub-circuit is a second switching network formed as a m bits of binary switching tree;
wherein each inputting terminal of the second switching network is coupled to the $0^{th}$ to the $(2^m-1)^{th}$ voltage dividing signal terminal, and an outputting terminal of the second switching network is coupled to an in-phase inputting terminal of the buffering sub-circuit.

6. The digital-to-analog conversion circuit of claim 1, wherein the $i^{th}$ voltage dividing signal terminal is coupled to an inverting inputting terminal of the buffering sub-circuit.

7. The digital-to-analog conversion circuit of claim 4, wherein the first switching network comprises a plurality of switches containing a P-channel metal oxide semiconductor field effect transistor and an N-channel metal oxide semiconductor field effect transistor.

8. The digital-to-analog conversion circuit of claim 5, wherein the second switching network comprises a plurality of switches containing a P-channel metal oxide semiconductor field effect transistor and an N-channel metal oxide semiconductor field effect transistor.

9. The digital-to-analog conversion circuit of claim 7, wherein a switch of the plurality of switches coupled to the $i^{th}$ voltage dividing signal terminal and the first to the $(2^{n-m}-1)^{th}$ sub-voltage dividing signal terminals contains the P-channel metal oxide semiconductor field effect transistor, and a switch of the plurality of switches coupled to the $(2^{n-m-1})^{th}$ to the $(2^{n-m}-1)^{th}$ sub-voltage dividing signal terminals contains the N-channel metal oxide semiconductor field effect transistor.

10. The digital-to-analog conversion circuit of claim 8, wherein a switch of the plurality of switches coupled to the $0^{th}$ voltage dividing signal terminal and the $(2^{m-1}-1)^{th}$ voltage dividing signal terminal contains the P-channel metal oxide semiconductor field effect transistor, and a switch of the plurality of switches coupled to the $(2^{m-1})^{th}$ to the $(2^m-1)^{th}$ voltage dividing signal terminals contains the N-channel metal oxide semiconductor field effect transistor.

11. A display apparatus comprising the digital-to-analog conversion circuit of claim 1.

12. A digital-to-analog conversion method for a digital-to-analog conversion circuit of claim 1, comprising:
receiving the first bit to the $(n-m)^{th}$ bit of the digital signal, and converting the first bit to the $(n-m)^{th}$ bit of the digital signal to the first analog signal;
receiving the $(n-m+1)^{th}$ bit to the $n^{th}$ bit of the digital signal, and converting the $(n-m+1)^{th}$ bit to the $n^{th}$ bit of the digital signal to the second analog signal;
generating an analog signal based on the first analog signal, the second analog signal and a signal from the $i^{th}$ voltage dividing signal terminal, and outputting the analog signal to the analog signal outputting terminal of the digital-to-analog conversion circuit.

13. The digital-to-analog conversion method of claim 12, wherein generating the analog signal based on the first analog signal, the second analog signal and the signal from the $i^{th}$ voltage dividing signal terminal comprises:
generating the analog signal, by summing the first analog signal and the second analog signal to obtain a summed signal and then subtracting the signal from the $i^{th}$ voltage dividing signal terminal from the summed signal.

\* \* \* \* \*